(12) United States Patent
Yang et al.

(10) Patent No.: US 7,279,782 B2
(45) Date of Patent: Oct. 9, 2007

(54) FBGA AND COB PACKAGE STRUCTURE FOR IMAGE SENSOR

(75) Inventors: Wen-Kun Yang, Hsin-Chu (TW); Chin-Chen Yang, Taipei (TW); Wen-Bin Sun, Taipei (TW); Jui-Hsien Chang, Jhudong Township, Hsinchu County (TW); Chun Hui Yu, Tainan (TW); His-Ying Yuan, Taoyuan (TW)

(73) Assignee: Advanced Chip Engineering Technology Inc., Hsinchu County (TW)

( * ) Notice: Subject to any disclaimer, the term of this patent is extended or adjusted under 35 U.S.C. 154(b) by 253 days.

(21) Appl. No.: 11/029,929

(22) Filed: Jan. 5, 2005

(65) Prior Publication Data

US 2006/0145325 A1    Jul. 6, 2006

(51) Int. Cl.
   *H01L 23/02*    (2006.01)
(52) U.S. Cl. .................................................. 257/680
(58) Field of Classification Search ........ 257/678–680, 257/430–433, E31.127
   See application file for complete search history.

(56) References Cited

U.S. PATENT DOCUMENTS

| | | | | |
|---|---|---|---|---|
| 4,827,118 A | 5/1989 | Shibata et al. | ............ | 250/211 |
| 6,483,030 B1* | 11/2002 | Glenn et al. | ................ | 174/521 |
| 6,624,921 B1* | 9/2003 | Glenn et al. | ................ | 359/291 |
| 6,727,431 B2* | 4/2004 | Hashimoto | ................... | 174/539 |
| 7,061,106 B2* | 6/2006 | Yang et al. | ................. | 257/723 |
| 2001/0020738 A1* | 9/2001 | Iizima et al. | ............... | 257/680 |
| 2003/0025825 A1 | 2/2003 | Nakajoh | .................... | 348/374 |
| 2003/0218175 A1 | 11/2003 | Ogawa et al. | ................ | 257/80 |
| 2004/0041938 A1 | 3/2004 | Seo et al. | ................... | 348/340 |

FOREIGN PATENT DOCUMENTS

KR    1020040075416    8/2004

* cited by examiner

*Primary Examiner*—Nathan W. Ha
(74) *Attorney, Agent, or Firm*—Kusner & Jaffe

(57) ABSTRACT

A structure of package comprises a die placed on printed circuit board. A glass substrate is adhered on an adhesive film pattern to form an air gap area between the glass substrate and the chip. Micro lens are disposed on the chip. A lens holder is fixed on printed circuit board. The glass substrate can prevent the micro lens from particle contamination.

25 Claims, 3 Drawing Sheets

FBGA AND COB PACKAGE STRUCTURE FOR IMAGE SENSOR

BACKGROUND OF THE INVENTION

1. Field of the Invention

This invention relates to a package structure, and more particularly to an image sensor package structure that can prevent the micro lens from particle contamination.

2. Description of the Prior Art

The package can have a core made of a common material such as glass epoxy, and can have additional layers laminated onto the core. These additional layers are also known as "built-up" layers. The built-up layers are typically formed from alternating layers of dielectric material and conductive material. Patterns may be built in the metal or conductive layer through various etching processes such as wet etching which are known in the art and will not be described further herein. Plated through holes called vias are used to make interconnects between various layers of metal. Using these layers and vias, several layers of interconnections may be built up.

Input/Output functions are typically accomplished using metal traces between the layers. Each trace has an impedance generated by its geometry and location on the package. Due to the manufacturing technology and material requirements, packages having built-up layers often include a number of degassing holes in the metal layers. Degassing holes allow gas to be evaporated during the manufacture of the package so that bubbles do not form in the package. Traces may be routed over or under the degassing holes, or around the degassing holes, or a combination thereof. Since the traces are not in the same location on the package, and pass over varying amounts of non-metal areas caused by degassing holes in the metal layers, the traces have an impedance variation, or mismatch.

A digital image technique has been wildly applied to image shooting instrument such as digital camera, image scanner, etc. The conventional CMOS sensor is disposed on a circuit board. The CMOS sensor has a die secured therein. The lens seat has a focusing lens for focusing the image onto the die of the CMOS sensor. Through the lens, the image signal is sent by the die to a digital processor for converting the analog signal into digital signal. The Die of the CMOS sensor is relatively sensitive to infrared ray and dust particles. If the unwanted particles are not removed from the sensor, it leads to downgrade the quality of the device. In order to achieve the purpose, the removal by manual may damage the sensitive chip. Typically, the image sensor module is formed by using a method of COB or LCC. One drawback of the COB is lower yield rate during packaging process due to particle contamination on sensing area. Besides, the drawbacks of the LCC are higher packaging cost and lower yield rate due to particle contamination on sensing area.

Further, micro lenses are optical components on semiconductors utilized as solid state imaging devices. One of the most important considerations in designing and manufacturing micro lenses is photosensitivity. One reason micro lens photosensitivity may be reduced is that the area of each micro lens has been reduced below an optimum value. Moreover, SHELL CASE company also develops wafer level package technique, the cost of the image sensor dice packaged by the SHELL CASE is higher due to requiring two glass plate and complicate process. And, the transparency is bad due to epoxy wearing out, and the potential reliability may be reduced. U.S. Pat. No. 5,514,888 for ON-DIE SCREEN TYPE SOLID STATE IMAGE SENSOR AND MANUFACTURING METHOD THEREOF; issued May 7, 1996 to Yoshikazu Sano, et al. teaches a method for forming charge-coupled devices (CCDS) on a silicon substrate. A micro lens array is formed over the CCD array using conventional lithography and re-flow techniques.

In view of the aforementioned, the present invention provides an improved package structure to overcome the above drawback.

SUMMARY OF THE INVENTION

Therefore, the main objective of the present invention is to provide a package for image sensor, such as COB (Chip On Board) or FBGA (Fine-pitch Ball Grid Array) package structure, without particle contamination on micro lens and method for manufacturing the same.

Another objective of the present invention is to use the glass substrate to prevent the micro lens from particle contamination.

The yet objective of the present invention is to provide a CMOS image sensor package module structure that the package may be directly cleaned to remove particle contamination.

The present invention provides a package structure. The structure of package comprises a die having a micro lens area, adhesive film pattern formed on the chip, and a substrate adhered on the adhesive film pattern to cover the micro lens area on the chip, thereby generating an air gap therebetween.

The present invention provides another structure of package. The structure of package comprises a printed circuit board having a plurality of connection pads. A die is placed on the printed circuit board, and the die has a plurality of bonding pads connected to the connection pads through a plurality of bonding wires, respectively. An adhesive film pattern is formed on the chip. A plurality of solder balls are formed on the first substrate. A glass substrate is adhered on the adhesive film pattern to cover a micro lens area on the chip, thereby generating an air gap therebetween.

The structure of package further comprises a protection material to substantially cover the plurality of bonding wires. The die comprises a micro lens formed there in.

The present invention provides a structure of package module. The structure of package module comprises a printed circuit board having a plurality of connection pads. A die is placed on the printed circuit board, and the die has a plurality of bonding pads connected to the connection pads through a plurality of bonding wires, respectively. An adhesive film pattern is formed on the chip. A glass substrate is adhered on the adhesive film pattern to cover a micro lens area on the chip, thereby generating an air gap therebetween. A lens holder is fixed on the printed circuit board, and the lens holder has at least one lens placed therein.

The structure of package module further comprises a protection material to substantially cover the plurality of bonding wires.

The structure of package module further comprises an IR CART/IR filtering layer fixed within the lens holder or formed on the glass substrate.

BRIEF DESCRIPTION OF THE DRAWINGS

The above objects, and other features and advantages of the present invention will become more apparent after reading the following detailed description when taken in conjunction with the drawings, in which.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims. Then, the components of the different elements are not shown to scale. Some dimensions of the related components are exaggerated and meaningless portions are not drawn to provide clearer description and comprehension of the present invention. The structure is adaptable to the FBGA (Fine-pitch Ball Grid Array) and COB (Chip On Board) type package. The present invention benefits lower cost and more simple process than the die scale package (CSP). The CSP type package suffers higher cost issue. Further, data processing speed of the FBGA package is far faster than conventional TSOP (Thin Small Outline Package) for inter-connection wires design.

Figure 1A:
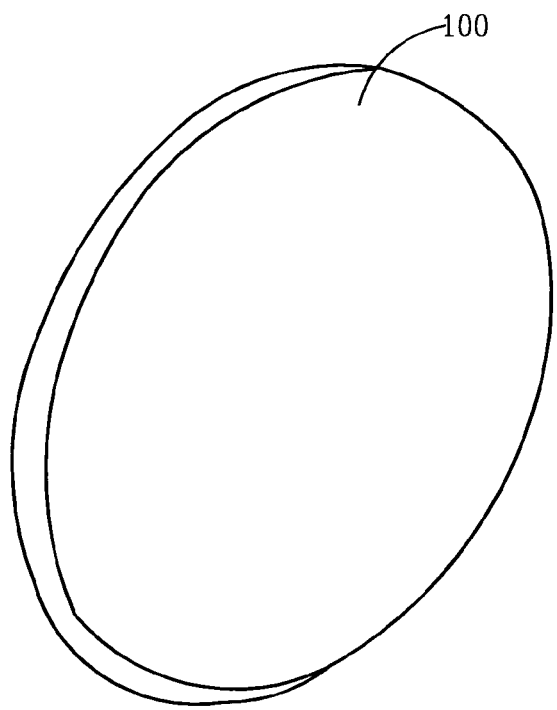
FIG. 1A is a schematic diagram of a glass substrate with an elastic film pattern according to the present invention.
Figure 1B:
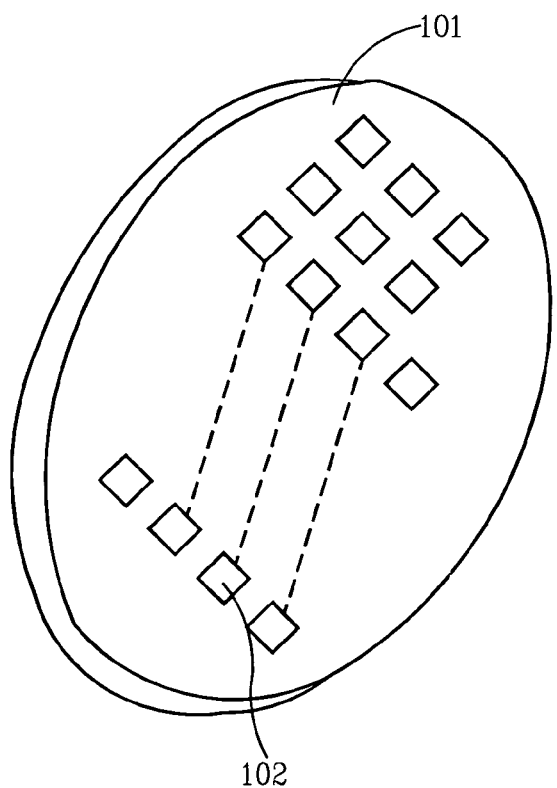
FIG. 1B is a schematic diagram of a processed wafer according to the present invention.
Figure 2:
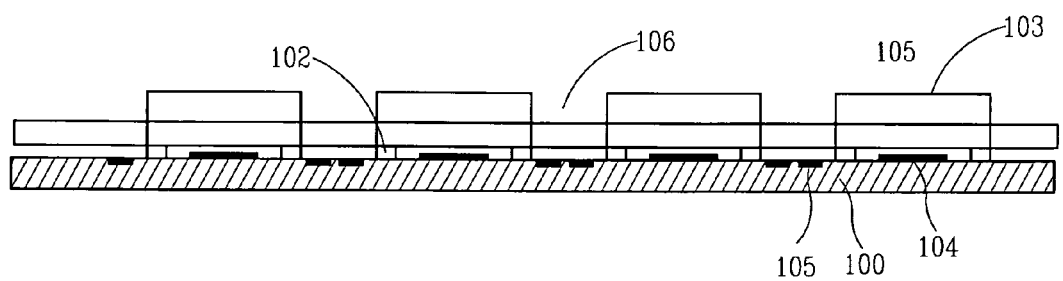
FIG. 2 is a schematic diagram of the wafer combining with the glass according to the present invention.

Referring first to FIG. 1A, a processed wafer 100 is provided. The processed wafer 100 bears a plurality of dice having devices formed therein. In one example, the devices include image sensors formed thereon. The image sensor includes CCD or CMOS sensor. An adhesive film pattern 102 is formed on a substrate 101, shown as FIG. 1B. The material of the adhesive film pattern 102 is elastic material, such as UV type or thermal type material. In one embodiment, the elastic material comprises BCB, SINR (Siloxane polymer), epoxy, polyimides or resin. Besides, the elastic film pattern 102 may be formed by printing, coating or tapping method. The substrate 101 comprises glass or quartz. The thickness of the substrate 101 is about from 100 um to 200 um. Then, the chip-side (or device side) of the wafer 100 is attached to elastic film pattern 102 of the glass 101 to expose bonding pads 105, such as Al pads, shown as FIG. 2. Therefore, a micro lens area 104 of the image sensor (not shown) in the wafer 100 is covered by the glass 101. A micro lens is generally formed on the top surfaces of image sensor. The edge of the die may be contacted with the elastic film pattern 102. Al pads 105 do not contact with the elastic film pattern 102. The processed wafer 100 bears a plurality of image sensor devices in sensing area. As know in the art, the image sensor includes an isolation layer formed over the wafer 100. A color filter layer is next formed over the isolation layer with sub-pixel areas properly aligned with active devices in the wafer 100. Another layer is generally formed over the color filter layer. There are several ways well known to those skilled in the art to proceed with the formation of a micro lens. One material found suitable for the micro lens is a mixture of melamine resin and generic novolac base resin. Subsequently, a photo resist (PR) is deposited over the glass 101. Conventional lithographic techniques are then utilized to form patterns 103 in the PR by using exposure and development step. Those steps are performed in the die formation procedure not package.

A photoresist (PR) is patterned on the glass 101 to expose the area not aligned to the image sensor area or micron lens area 104. The glass 101 is then etched by a wet etching process to remove partial glass exposed by the PR under an area 106, thereby exposing Al pads 105 and the partial silicon die. For example, the wet etching solution is HF or BOE, etc. PR is then stripped. The micro lens area 104 is protected by the glass 101 from particle contamination.

Figure 3:
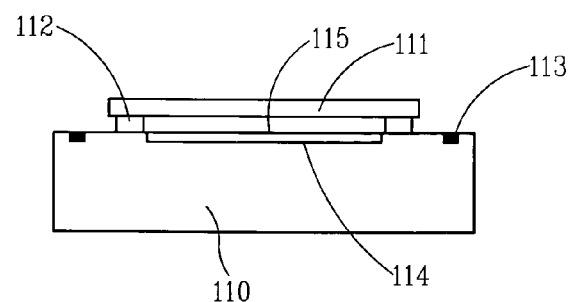
FIG. 3 is a schematic diagram of an individual CMOS/CCD image sensor die structure according to the present invention.

Referring to FIG. 3, the wafer is divided to obtain a plurality of an individual CMOS or CCD image sensor die 110. From the individual package structure, micro lenses are formed on the top surfaces of the die 110, the edge of the divided glass 111 contacts to the elastic film pattern 112. Contact pads 113 are located at the edge of the die 110 without contacting with the elastic film pattern 112. The glass 101 is attached on the top surfaces of the die 110 through the elastic film pattern 112. An air gap 115 is created between the die 110 and the glass 111 and over the micron lens area 114.

Figure 4:
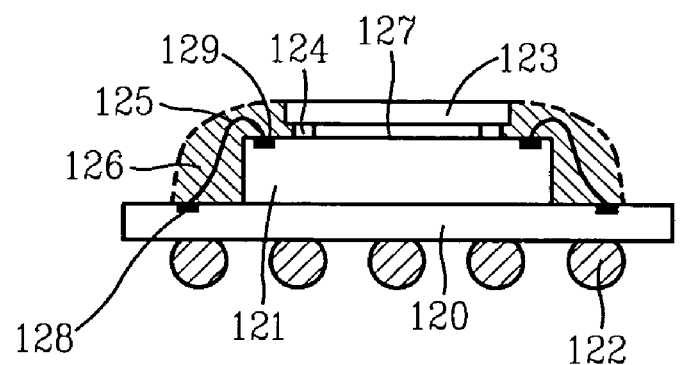
FIG. 4 is a schematic diagram of an individual FBGA (Fine-pitch Ball Grid Array) package structure according to the present invention.

Referring to FIG. 4, it is an individual FBGA (Fine-pitch Ball Grid Array) package. Data processing speed of the FBGA package is far faster than conventional TSOP (Thin Small Outline Package) for inter-connection wires design. Similar to above-mentioned, a glass 123 is attached on the top surfaces of a die 121 through the elastic film pattern 124. Contact pads 129 are formed on the top edge of the die 121 for wire bonding. The die 121 comprises CMOS sensor or CCD. Al pads 129 are connected to the connection pads 128 of a substrate 120 through a plurality of bonding wires 125, respectively. Then, a protection material or molding 126 is substantially covered the pluralities of the bonding wires 125, Al pads 129 and the connection pads 128 except the top of the glass 123 to allow the light to pass through. In one embodiment, the protection material 126 comprises compound, liquid compound, and the protection material 126 may be formed by molding or gluing method. For example, the substrate 120 comprises a plurality of solder balls 122 connecting with external devices. As the same, a micro lens may be formed on the micro lens area 127, and an air gap is created between the die 121 and the glass 123. The glass 123 may prevent the micro lens from particle containment. The user may use liquid or air flush to remove the particles on the glass 123 without damaging the micron lens.

Figure 5:
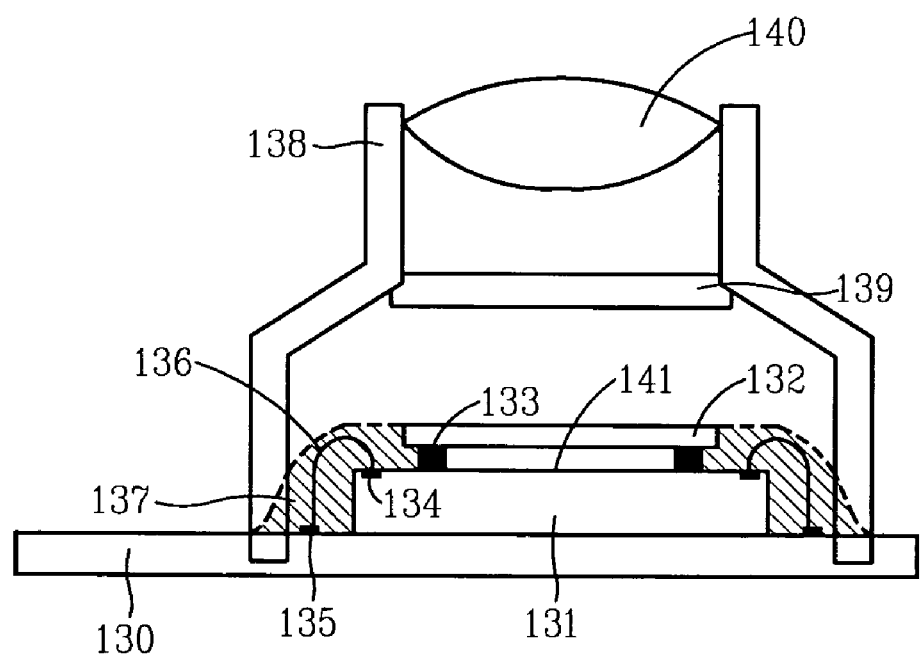
FIG. 5 is a schematic diagram of an individual COB (Chip On Board) package nodule structure according to the present invention.

Referring to FIG. 5, it is an individual COB (Chip On Board) package module. Similar to above-mentioned, a glass 132 is attached on the top surfaces of a die 131 through the elastic film pattern 133 to expose Al pads 134 for wire bonding. The die 121 comprises CMOS sensor or CCD image sensor. Al pads 134 are connected to the connection pads 135 of a printed circuit board 130 through a plurality of bonding wires 136, respectively. Then, a protection material 137 is substantially covered the pluralities of the bonding wires 136, Al pads 134 and the connection pads 135 except the top of the glass 132 to allow the light to pass through. In one embodiment, the protection material 137 comprises compound, liquid compound, and the protection material 137 may be formed by molding or gluing method. As the same, a micro lens may be formed on the micro lens area 141, and an air gap is created between the die 131 and the glass 132. A lens holder 138 is fixed on the printed circuit board 130 to hold a lens 140. A filter 139, such as an IR CART, is fixed to the lens holder 138. Alternatively, the filter 139 may comprise a filtering layer, for example IR filtering layer, formed upper or lower surface of the glass 132 to act as a filter. In one embodiment, IR filtering layer comprises $TiO_2$, light catalyzer. The glass 132 may prevent the micro lens from particle containment. The user may use liquid or air flush to remove the particles on the glass 132 without damaging the micron lens.

Hence, according to the present invention, the aforementioned package structure has the advantages list as follow: the FBGA or COB package structure of the present invention can prevent the micro lens from particle contamination. Moreover, CMOS/CCD image sensor package module structure may be directly cleaned to remove particle contamination. The process of manufacturing of the FBGA or COB package structure of the present invention is significantly simple.

Although specific embodiments have been illustrated and described, it will be obvious to those skilled in the art that various modifications may be made without departing from what is intended to be limited solely by the appended claims.

What is claimed is:

1. A FBGA (Fine-pitch Ball Grid Array) package structure, comprising:
   a die formed on a substrate, said die having a micron lens area;
   adhesive film pattern formed on said die;
   a transparent material adhered on said adhesive film pattern to cover said micro lens area on said die, thereby generating an air gap therebetween;
   first pads formed on said substrate and second pads formed on said die;
   wires connected between said first pads and second pads;
   molding material substantially covered said wires;
   conductive bumps attached on a under surface of said substrate; and
   an IR filter formed above said micro lens area, wherein material of said IR filter comprises $TiO_2$ or light catalyzer.

2. The structure in claim 1, wherein said die is an image sensor.

3. The structure in claim 2, wherein said image sensor is CMOS image sensor.

4. The structure in claim 2, wherein said image sensor is CCD image sensor.

5. The structure in claim 1, wherein material of said adhesive film pattern is elastic material.

6. The structure in claim 5, wherein said elastic material comprises UV type or thermal type material.

7. The structure in claim 1, wherein said adhesive film pattern is formed by printing or tapping method.

8. The structure in claim 1, wherein said transparent material comprises glass or quartz.

9. The structure in claim 1, wherein said molding material comprises compound or liquid compound.

10. The structure in claim 1, wherein said molding material is formed by molding or gluing method.

11. A Chip On Board (COB) structure of package module, comprising:
    a substrate;
    a die placed on said substrate, said die having a plurality of bonding pads and a micro lens area;
    adhesive film pattern formed on said die; wherein material of said adhesive film pattern including UV type material;
    a transparent material adhered on said adhesive film pattern to cover a micro lens area on said die, thereby generating an air gap there between;
    a lens holder fixed on said substrate, said lens holder having at least one lens placed therein;
    first pads formed on said substrate and second pads formed on said die;
    wires connected between said first pads and second pads;
    molding material substantially covered said wires; and
    an IR filter formed above said micro lens areas, wherein material of said IR filter comprises $TiO_2$ or light catalyzer.

12. The structure in claim 11, wherein said die is an image sensor.

13. The structure in claim 12, wherein said image sensor is CMOS image sensor.

14. The structure in claim 12, wherein said image sensor is CCD image sensor.

15. The structure in claim 11, wherein material of said adhesive film is elastic material.

16. The structure in claim 15, wherein said elastic material comprises UV type or thermal type material.

17. The structure in claim 11, wherein said adhesive film pattern is formed by printing or tapping method.

18. The structure in claim 11, wherein said transparent material comprises glass or quartz.

19. The structure in claim 11, wherein a thickness of said transparent material is from about 100 µm to 200 µm.

20. The structure in claim 11, wherein said substrate comprises printed circuit board.

21. The structure in claim 11, wherein said molding material comprises compound or liquid compound.

22. The structure in claim 11, wherein said molding material is formed by molding or gluing method.

23. The structure in claim 11, further comprising a filter formed within said lens holder.

24. The structure in claim 23, wherein said filter is an IR filtering layer formed on a surface of said transparent material.

25. The structure in claim 23, wherein said filter is IR filter fixed within said lens holder.

* * * * *